United States Patent
Nakatsuka et al.

(10) Patent No.: US 7,173,471 B2
(45) Date of Patent: Feb. 6, 2007

(54) HIGH FREQUENCY SWITCHING CIRCUIT AND SEMICONDUCTOR DEVICE

(75) Inventors: Tadayoshi Nakatsuka, Callisensvej (DK); Atsushi Suwa, Takatsuki (JP); Katsushi Tara, Kyoto (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/864,351

(22) Filed: Jun. 10, 2004

(65) Prior Publication Data
US 2005/0017786 A1 Jan. 27, 2005

(30) Foreign Application Priority Data
Jun. 13, 2003 (JP) .............................. 2003-168884

(51) Int. Cl.
*H03L 5/00* (2006.01)

(52) U.S. Cl. ...................... 327/308; 327/427; 327/379; 327/431; 333/81 R; 333/104; 333/145

(58) Field of Classification Search .................... None
See application file for complete search history.

(56) References Cited

U.S. PATENT DOCUMENTS

| | | | | |
|---|---|---|---|---|
| 4,030,515 A | * | 6/1977 | Weber | 135/25.3 |
| 5,350,957 A | * | 9/1994 | Cooper et al. | 327/427 |
| 5,477,184 A | * | 12/1995 | Uda et al. | 327/404 |
| 5,717,356 A | * | 2/1998 | Kohama | 327/427 |
| 5,777,530 A | * | 7/1998 | Nakatuka | 333/104 |
| 5,945,867 A | * | 8/1999 | Uda et al. | 327/431 |
| 6,803,680 B2 | * | 10/2004 | Brindle et al. | 307/115 |
| 6,804,502 B2 | * | 10/2004 | Burgener et al. | 455/333 |
| 2004/0085118 A1 | | 5/2004 | Numata | |
| 2004/0207454 A1 | * | 10/2004 | Hidaka et al. | 327/427 |
| 2005/0179506 A1 | * | 8/2005 | Takahashi et al. | 333/104 |

FOREIGN PATENT DOCUMENTS

| | | |
|---|---|---|
| EP | 903855 A | 3/1999 |
| EP | 1357630 A | 10/2003 |
| JP | 8195667 | 7/1996 |
| JP | 8204528 | 8/1996 |
| JP | 10084267 | 3/1998 |
| JP | 10209835 | 8/1998 |
| JP | 11234106 | 8/1999 |
| JP | 2002232278 | 8/2002 |
| JP | 2002232278 A | 8/2002 |

* cited by examiner

*Primary Examiner*—Tuan T. Lam
*Assistant Examiner*—Hiep Nguyen
(74) *Attorney, Agent, or Firm*—Stevens, Davis, Miller & Mosher, LLP

(57) ABSTRACT

Four switching circuit sections consisting of four FETs connected in series are provided between a plurality of input/output terminals which output and input a high frequency signal. Gate control voltages are individually applied to gate terminals of four FETs, respectively, so that an on-state and an off-state are achieved. Further drain control voltages are individually applied to drain terminals or source terminals of the FET in each switching circuit section, and a voltage according to an electric power value of the high frequency signal supplied to each of switching circuit sections is supplied as the gate control voltage and the drain control voltage.

17 Claims, 11 Drawing Sheets

HIGH FREQUENCY SWITCHING CIRCUIT AND SEMICONDUCTOR DEVICE

BACKGROUND OF THE INVENTION

1. Field of the Invention

The present invention relates to a high frequency switching circuit which performs amplification, switching, or the like of a signal in a mobile communication apparatus or the like, and a semiconductor device in which this high frequency switching circuit is integrated on a semiconductor substrate.

2. Prior Art

A conventional high frequency switching circuit comprises FETs 101 through 104, and 109 through 112, resistance elements 201 through 204, 209 through 212, 250 through 253, and 256 through 259, first through third signal input/output terminals 501 through 503, and first and second control terminals 610, 620 as shown in FIG. 10.

In this high frequency switching circuit, the first control terminal 610 is connected to the third signal input/output terminal 503, and the second control terminal 620 is connected to the second signal input/output terminal 502, so that a bias voltage is applied to the FETs 101 through 104, and the FETs 109 through 112 (for example, refer to Japanese Patent Application Laid-Open No. 2002-232278 (Page 13, FIG. 6)).

In this configuration, when a signal level supplied is relatively as small as about 20 dBm, sufficient high frequency characteristics can be obtained.

However, in the conventional configuration described above, it is necessary to make voltages of the first and second control terminals 610 and 620 higher as the signal level supplied becomes larger. Incidentally, since an excessive reverse bias is applied to gate-source and gate-drain of each of off-state FETs for a long time, it takes time for the FETs to become an on-state from an off-state. As a result, there has been a problem that a rising edge of an output waveform is rounded.

The relationship between the timing of the signal and the voltage in the high frequency switching circuit in FIG. 10 is shown in FIG. 11.

FIG. 11(a) shows a timing chart of electric power supplied to the second signal input/output terminal 502, and a communication mode of a time division multiple access (TDMA) is assumed. For example, in the case of a GSM (Global System for Mobile Communication) mode, one slot is assigned to transmission and reception, respectively, for a terminal among time slots separated into eight slots. A span of each slot is 577 microsecond.

There is shown a situation in FIG. 11 as an example where after performing transmission between time t2 and time t3, reception is performed at either slot between time t3 and time t6, and transmission is performed again between time t6 and time t7.

FIG. 11(b) shows a timing chart of the voltage of the first control terminal 610 (first control signal), and there is shown a situation where the FETs 101 through 104 for transmission are turned on before transmission is performed (time t1), and the FETs 101 through 104 for transmission are turned off after the transmission is completed (time t4).

FIG. 11(c) shows a chart of the voltage of the second control terminal 620, and it will be understood that a control signal with opposite phase to the signal shown in FIG. 11(b) is applied. As shown in FIG. 11(b), 5 V is applied upon transmission and 0 V is applied except upon transmission as a drain-source bias of the respective FETs 101 through 104 in FIG. 10. Accordingly, a voltage of −5 V is applied to drain-gate and source-gate of the respective FETs 101 through 104 except upon transmission as shown in FIG. 11(d).

Thus, in order to achieve an off-state, a high reverse bias state is maintained, as a result, there causes a problem that it takes long time for the FETs to completely turn on when changing to an on-state next, thereby generating a phenomenon that a rising edge of a transmission waveform is rounded.

FIG. 11(e) shows a chart of electric power supplied from the first input/output terminal 501, and it is shown that the output waveform is rounded.

In FIG. 11(d), a slash portion shows a product of the bias voltage of the FETs 101 through 104 and the time (bias voltage and time product), and the smaller the area is, the further the waveform can hardly be rounded. Incidentally, symbol P1 in FIG. 11(a) shows input power, symbol P2 in FIG. 11(e) shows output power, and (P1−P2) is equivalent to insertion loss of the high frequency switching circuit.

SUMMARY OF THE INVENTION

The object of the present invention is to provide a superior high frequency switching circuit and a semiconductor device, the output waveform of which is not rounded.

The aim of the present invention is to solve the problem of the conventional configuration described above, and it is configured such that a gate control voltage is applied to gates of a plurality of FETs which comprise each of a plurality of switching circuit sections and are connected in series, and a drain control voltage is also applied to a drain terminal or a source terminal of each FET. In addition, a voltage according to an electric power value of a high frequency signal supplied to the switching circuit section is supplied as the gate control voltage and the drain control voltage, so that there is provided the high frequency switching circuit, the output waveform of which is not rounded. It is preferable that the drain control voltage and the gate control voltage are separately applied to each FET.

A high frequency switching circuit of a first invention comprises a plurality of switching circuit sections arranged between a plurality of input/output terminals which output and input a high frequency signal, wherein each of the plurality of switching circuit sections is comprised of a circuit consisting of a plurality of field effect transistors connected in series, and a gate control voltage is applied to gate terminals of the plurality of field effect transistors, so that an on-state and an off-state are achieved. Further, a drain control voltage is applied to drain terminals or source terminals of the plurality of field effect transistors of each of the plurality of switching circuit sections, and a voltage according to an electric power value of the high frequency signal supplied to the plurality of switching circuit sections is supplied as the gate control voltage and the drain control voltage.

Herein, it is preferable to use the gate control voltage supplied to the plurality of switching circuit sections as the drain control voltage supplied to the plurality of switching circuit sections.

Moreover, it is preferable that the highest voltage among the plurality of gate control voltages supplied to the plurality of switching circuit sections or a voltage given by a logical-OR of the plurality of gate control voltages is supplied as the drain control voltage supplied to the plurality of switching circuit sections.

Moreover, it is preferable that the highest voltage among the gate control voltages supplied to the plurality of switching circuit sections and a reference voltage supplied from an external source, or a voltage given by a logical-OR of the gate control voltages supplied to the plurality of switching circuit sections and the reference voltage supplied from an external source is supplied as the drain control voltage supplied to the plurality of switching circuit sections.

Moreover, the plurality of switching circuit sections are circuits for switching transmission and reception of the high frequency signal, and it is preferable that a drain control voltage is supplied to a plurality of switching circuit sections before transmission and reception of the high frequency signal are preformed and the voltage supply is terminated after the transmission and reception are completed.

A high frequency switching circuit of a second invention comprises: a plurality of transmission terminals to which a high frequency signal is supplied; a plurality of reception terminals from which the high frequency signal is supplied; one or more input/output terminals which input or output the high frequency signal; and a plurality of switching circuit sections arranged between the plurality of transmission terminals and the one or more input/output terminals, and between the plurality of reception terminals and the one or more input/output terminals.

Each of the plurality of switching circuit sections is comprised of a circuit consisting of a plurality of field effect transistors connected in series, a gate control voltage is applied to gate terminals of the plurality of field effect transistors, so that an on-state and an off-state are achieved. Further, in the plurality of switching circuit sections, a voltage given by a logical-OR of gate control voltages of the switching circuit sections connected with the plurality of transmission terminals except a selected transmission terminal is supplied to a drain terminal or a source terminal of a selected switching circuit section between the selected transmission terminal to which a transmission signal is supplied among the plurality of transmission terminals and an input/output terminal as a drain control voltage. Moreover, a voltage given by a logical-OR of the gate control voltages of the switching circuit sections connected with the plurality of transmission terminals is applied to drain terminals or source terminals of the field effect transistors of the switching circuit sections connected with the plurality of reception terminals as the drain control voltage.

A high frequency switching circuit of a third invention comprises: a plurality of transmission terminals to which a high frequency signal is supplied; a plurality of reception terminals from which the high frequency signal is supplied; one or more input/output terminals which input or output the high frequency signal; and a plurality of switching circuit sections arranged between the plurality of transmission terminals and the one or more input/output terminals, and between the plurality of reception terminals and the one or more input/output terminals.

Each of the plurality of switching circuit sections is comprised of a circuit consisting of a plurality of field effect transistors connected in series, and a gate control voltage is applied to gate terminals of the plurality of field effect transistors, so that an on-state and an off-state are achieved. Further, in said plurality of switching circuit sections, a voltage given by a logical-OR of gate control voltages of the plurality of switching circuit sections connected to transmission terminals except a k-th transmission terminal (k is an integer between 1 and n, both inclusive and n is the number of the transmission terminals) among the plurality of transmission terminals, and a reference voltage is applied to a drain terminal or a source terminal of a k-th switching circuit section between the k-th transmission terminal among the plurality of transmission terminals, and either of one or more input/output terminals as a drain control voltage. Moreover, a voltage given by a logical-OR of the gate control voltages of the plurality of switching circuit sections connected to the plurality of transmission terminals, and the reference voltage is applied to drain terminals or source terminals of the field effect transistors of the plurality of switching circuit sections connected to the plurality of reception terminals as the drain control voltage.

In a configuration of the first through third inventions, it is preferable to apply a voltage with opposite phase to the gate control voltage of the plurality of field effect transistors via a diode to drain or source terminals of a plurality of field effect transistors comprising the switching circuit section to which the drain control voltage is not supplied among the plurality of switching circuit sections.

Moreover, in a configuration of the first invention described above, it is preferable that at least one of the plurality of input/output terminals comprises a switching circuit section for shunt, and it is further preferable that a voltage with opposite phase to the gate control voltage of the plurality of field effect transistors is applied via a diode to drain or source terminals of a plurality of field effect transistors comprising the switching circuit section to which the drain control voltage is not supplied among the plurality of switching circuit sections, and a control voltage of the switching circuit section for shunt is employed as a voltage with opposite phase to the gate control voltage of the plurality of field effect transistors.

Moreover, in a configuration of the second or third invention described above, it is preferable that the plurality of transmission terminals and the plurality of reception terminals are comprised of the switching circuit sections used for shunt, and it is further preferable that a voltage with opposite phase to the gate control voltage of the plurality of field effect transistors is applied via a diode to drain or source terminals of a plurality of field effect transistors comprising the switching circuit section to which the drain control voltage is not supplied among the plurality of switching circuit sections, and a control voltage of the switching circuit section for shunt is employed as a voltage with opposite phase to the gate control voltage of the plurality of field effect transistors.

Moreover, in a configuration of the first through third inventions described above, it is preferable that a circuit which generates a drain control voltage is comprised of an OR circuit consisting of a plurality of diodes.

A semiconductor device of the present invention integrates the high frequency switching circuit of either of the first through third inventions on a semiconductor substrate As having been described above, according to the present invention, the drain control voltages are individually applied to the drain terminal or the source terminal of the FET, and the voltage according to the electric power value of the high frequency signal supplied to the switching circuit section is supplied as the gate control voltage and the drain control voltage, thereby making it possible to provide a superior high frequency switching circuit and a semiconductor device which do not cause a waveform to be rounded.

DETAILED DESCRIPTION OF THE PREFERRED EMBODIMENTS (First Embodiment)

Figure 1:
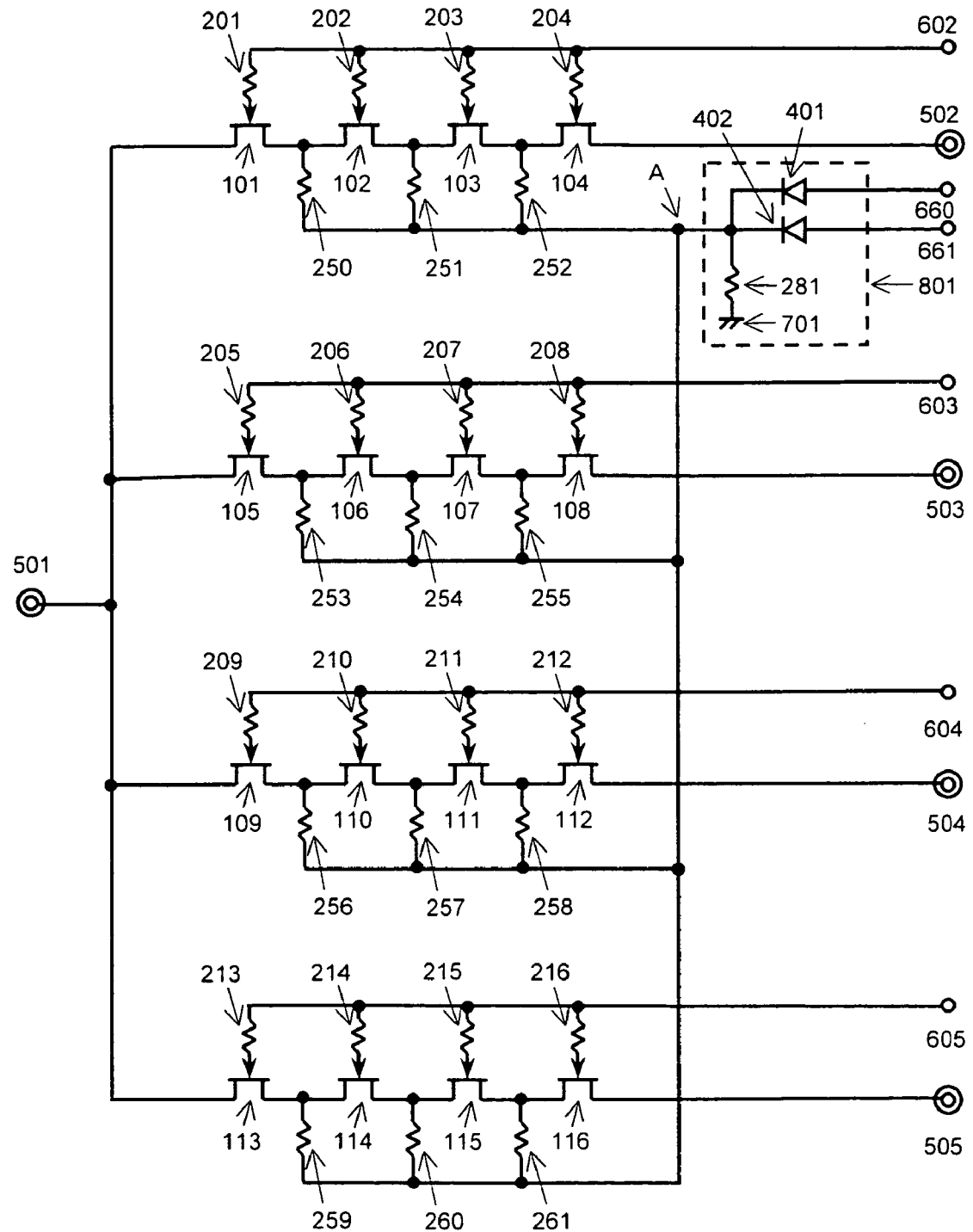
FIG. 1 is a circuit diagram showing an equivalent circuit of a high frequency switching circuit of a first embodiment of the present invention.

FIG. 1 shows a configuration of a high frequency switching circuit of a first embodiment of the present invention. In FIG. 1, reference numerals 101 through 116 represent depletion type field effect transistors (henceforth referred to as FET) which configure four switching circuit sections. Reference numerals 201 through 216 represent resistance elements. Reference numerals 250 through 261 represent resistance elements. Reference numeral 281 represents a resistance element. Reference numeral 501 represents a first input/output terminal connected to, for example an antenna. Reference numeral 502 represents a second input/output terminal connected to, for example a first transmitting circuit section. Reference numeral 503 represents a third input/output terminal connected to, for example a second transmitting circuit section. Reference numeral 504 represents a fourth input/output terminal connected to, for example a first receiving circuit section. Reference numeral 505 represents a fifth input/output terminal connected to, for example a second receiving circuit section. Reference numeral 602 represents a first input/output control terminal. Reference numeral 603 represents a second input/output control terminal. Reference numeral 604 represents a third input/output control terminal. Reference numeral 605 represents a fourth input/output control terminal. Reference numeral 660 represents a first bias terminal. Reference numeral 661 represents a second bias terminal. Reference numerals 401 and 402 represent diodes which configure an OR circuit. Reference numeral 701 represents an earth. Reference numeral 801 represents an OR circuit.

Hereinafter, description will be made of the operation of the high frequency switching circuit configured as shown in FIG. 1 described above.

At first, when a signal level to be treated is relatively as small as about 20 dBm or less, in order to supply a signal supplied from the second input/output terminal 502 to the first input/output terminal 501, 3 V is applied to the first input/output control terminal 602 as a high-level voltage, and 0 V is applied to the second through fourth input/output control terminals 603 through 605 as a low-level voltage. At this time, 3 V which is a typical power supply voltage is applied to the first bias terminal 660, and 0 V is applied to the second bias terminal 661.

Although a potential of point A is 3 V when the resistance value of the resistance element 281 is extremely large, the potential of point A can be changed to any value by means of adjusting the resistance value of the resistance element 281. In this embodiment, the potential of point A is set to 2.8 V by means of setting the resistance value of the resistance element 281 to 200 Kohm.

Since the depletion type FETs with a threshold value of about −0.6 V are used for the FETs 101 through 116, the FETs 101 through 104 to which a high-level voltage is applied become an on-state, and the FETs 105 through 116 to which a low-level voltage is applied become an off-state under the voltage condition described above.

The second input/output terminal 502 and the first input/output terminal 501 are connected with a low resistance by the FETs 101 through 104 staying in on-state, and a signal supplied to the second input/output terminal 502 is supplied to the first input/output terminal 501 through the FETs 101 through 104 staying in on-state. At that time, since 2.8 V which is the potential of point A is applied to each drain and each source of the FETs 101 through 116 via the resistance elements 250 through 261 and a voltage is fixed, a signal transmission with low distortion is achieved.

If it is not a configuration of supplying the voltage via the resistance 250 through 261, then potentials of FET junction points in the FETs 105 through 108, 109 through 112, and 113 through 116 are not fixed, so that either FET may turn on. As a result, the waveform is distorted and the harmonic content will be generated. In this case, since a small signal operation is performed, 2.8 V is sufficient for a voltage to be fixed.

Similarly, if a signal level is small, when a signal supplied from the first input/output terminal 501 is received by the fourth input/output terminal 504, 3 V is applied to the third input/output control terminal 604 as a high-level voltage, and 0 V is applied to the first, second, and fourth input/output control terminals 602, 603, and 605 as a low-level voltage. At this time, 3 V which is a typical power supply voltage is applied to the first bias terminal 660, and 0 V is applied to the second bias terminal 661. The potential of point A which is an output of the OR circuit 801 is therefore 2.8 V similar to the above.

Accordingly, the FETs 109 through 112 become an on-state, and the FETs 101 through 108 and 113 through 116 become an off-state. The signal supplied to the first input/output terminal 501 is therefore supplied to the fourth input/output terminal 504 through the FETs 109 through 112. At this time, since 2.8 V which is the potential of point A is applied to each drain and each source of the FETs 101 through 116 via the resistance elements 250 through 261, a signal transmission is achieved as similar to the above.

Next, if a signal level to be treated is as large as 20 dBm or more, in order to supply a signal supplied from the second input/output terminal 502 to the first input/output terminal 501, 5 V is applied to the first input/output control terminal 602 as a high-level voltage, and 0 V is applied to the second through fourth input/output control terminals 603 through 605 as a low-level voltage.

At this time, 3 V which is a power supply voltage is applied to the first bias terminal 660, so that the potential of point A which is the output of the OR circuit 801 is set to 4.8 V by applying 5 V to the second bias terminal 661. Accordingly, 4.8 V which is the potential of point A is applied to each drain and each source of the FETs 101 through 116 via the resistance elements 250 through 261, thereby achieving a signal transmission with low distortion even when a large signal is supplied.

In this case, since a large signal operation is performed, either of the FETs 105 through 108, 109 through 112, and 113 through 116 that should be turned off may turn on, so that the voltage of 2.8 V at point A is insufficient. If either of the FETs turns on, the waveform will be distorted and the harmonic content will be generated. For this reason, the voltage of 4.8 V is supplied.

Thus, the voltage of the second bias terminal 661 is associated with the input power to the second input/output terminal 502, thereby achieving the voltage condition described above.

Similarly, if a signal level is large, when the signal supplied from the first input/output terminal 501 is received by the fourth input/output terminal 504, 5 V is applied to the third input/output control terminal 604 as a high-level voltage, and 0 V is applied to the first, second, and fourth input/output control terminals 602, 603, and 605 as a low-level voltage.

At this time, 3 V which is a power supply voltage is applied to the first bias terminal 660, and 5 V is applied to the second bias terminal 661, so that the potential of point A which is the output of the OR circuit 801 is set to 4.8 V.

Accordingly, the FETs 109 through 112 become an on-state, and the FETs 101 through 108 and 113 through 116 become an off-state. The signal supplied to the first input/output terminal 501 is therefore supplied to the third input/output terminal 504 through the FETs 109 through 112. At this time, 4.8 V which is the potential of point A is applied to each drain and each source of the FETs 101 through 116 via the resistance elements 250 through 261. Therefore, a signal transmission with low distortion is achieved. Also in this case, the voltage of the second bias terminal 661 is associated with the input power to the first input/output terminal 501, thereby achieving the voltage condition described above.

Incidentally, the resistance element 281 is effective also in order to discharge a charge, thereby making it possible to switch quickly even when the potential of point A changes to 0.2.8 V from 4.8 V.

Moreover, since the gate-source and the gate-drain of each of the FETs 101 through 116 have a symmetrical structure, the same characteristics are obtained even when the connections to the drain and the source are changed.

In addition, although a configuration where the potential of point A of the OR circuit 801 is supplied to the FETs of all switching circuit sections as the drain control voltage is shown in the embodiment described above, a voltage with opposite phase to the gate control voltage supplied to the FETs of the switching circuit section may be supplied to either of the switching circuit sections via a diode instead of supplying the drain control voltage from the OR circuits 801 to the drain or the source of the FET as described above (refer to FIG. 8 and FIG. 9).

(Second Embodiment)

Figure 2:
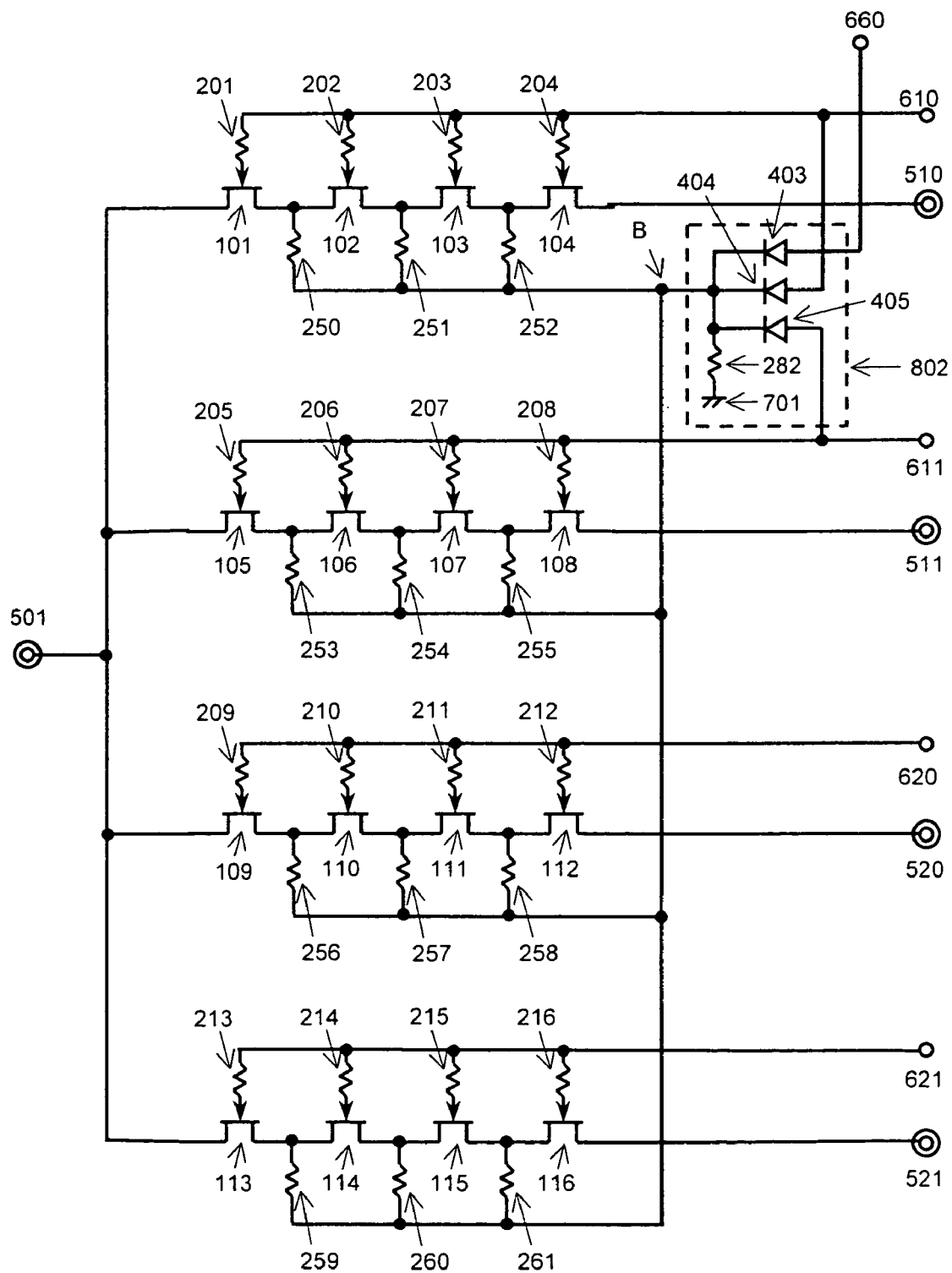
FIG. 2 is a circuit diagram showing an equivalent circuit of a high frequency switching circuit of a second embodiment of the present invention.

FIG. 2 shows a configuration of a high frequency switching circuit of a second embodiment of the present invention. In FIG. 2, reference numerals 101 through 116 represent FETs which configure four switching circuit sections. Reference numerals 201 through 216 represent resistance elements. Reference numerals 250 through 261 represent resistance elements. Reference numeral 282 represents a resistance element. Reference numerals 403 through 405 represent diodes which configure an OR circuit. Reference numeral 501 represents an input/output terminal connected to, for example an antenna. Reference numeral 510 represents a first transmission terminal connected to a first transmitting circuit section. Reference numeral 511 represents a second transmission terminal connected to a second transmitting circuit section. Reference numeral 520 represents a first reception terminal connected to a first receiving circuit section. Reference numeral 521 represents a second reception terminal connected to a second receiving circuit section. Reference numeral 610 represents a first control terminal for transmission. Reference numeral 611 represents a second control terminal for transmission. Reference numeral 620 represents a first control terminal for reception. Reference numeral 621 represents a second control terminal for reception. Reference numeral 660 represents a reference voltage terminal. Reference numeral 701 represents an earth. Reference numeral 802 represents an OR circuit. Hereinafter, description will be made of the operation of the high frequency switching circuit configured as shown in FIG. 2 described above.

When a signal supplied from the first transmission terminal 510 is supplied to the input/output terminal 501, 5 V is applied to the first control terminal for transmission 610 as a high-level voltage, and 0 V is applied to the second control terminal for transmission 611 and first and second control terminals for reception 620 and 621 as a low-level voltage.

In FIG. 2, since the depletion type FETs with a threshold value of about −0.6 V are used for the FETs 101 through 116, the FETs 101 through 104 to which a high-level voltage is applied become an on-state, and the FETs 105 through 116 to which a low-level voltage is applied become an off-state under the voltage condition described above. The first transmission terminal 510 and the input/output terminal 501 are connected with a low resistance by the FETs 101 through 104 being in on-state, so that a transmission signal is supplied from the first transmission terminal 510 through the FETs 101 through 104 to the input/output terminal 501.

In addition, when a signal supplied from the input/output terminal 501 is received by the first reception terminal 520, a high-level voltage 3 V is applied to the first control terminal for reception 620, a low-level voltage 0 V is applied to the first and second control terminals for transmission 610 and 611, and the second control terminal for reception 621. Accordingly, the FETs 109 through 112 become an on-state, and the FETs 101 through 108, and 113 through 116 become an off-state, so that a signal is supplied from the input/output terminal 501 through the FETs 109 through 112 and received via the first reception terminal 520.

Inputs to the OR circuit 802 are three types of voltages supplied to two control terminals for transmission 610 and 611, and the reference voltage terminal 660. A voltage corresponding to a logical-OR of each terminal voltage of two control terminals for transmission 610 and 611 and the reference voltage terminal 660 is supplied to point B which is an output of the OR circuit 802. 3 V which is a typical power supply voltage is used as the reference voltage in this embodiment. The relationship between the input voltage and the output voltage at this time is shown in Table 1.

TABLE 1

| | Input voltage | | | | | Output voltage of point of B | Gate-source voltage and gate-drain voltage of FETs 109 through 112 | Gate-source voltage and gate-drain voltage of FETs 113 through 116 | Gate-source voltage and gate-drain voltage of FETs 101 through 104 | Gate-source voltage and gate-drain voltage of FETs 105 through 108 |
|---|---|---|---|---|---|---|---|---|---|---|
| State | Voltage of the control terminal 610 | Voltage of the control terminal 611 | Voltage of the reference voltage terminal 660 | Voltage of the control terminal 620 | Voltage of the control terminal 621 | | | | | |
| 1 | 0 V | 0 V | 3 V | 3 V | 0 V | 2.8 V | +0.2 V | −2.8 V | −2.8 V | −2.8 V |
| 2 | 0 V | 0 V | 3 V | 0 V | 3 V | 2.8 V | −2.8 V | +0.2 V | −2.8 V | −2.8 V |
| 3 | 5 V | 0 V | 3 V | 0 V | 0 V | 4.8 V | −4.8 V | −4.8 V | +0.2 V | −4.8 V |
| 4 | 0 V | 5 V | 3 V | 0 V | 0 V | 4.8 V | −4.8 V | −4.8 V | −4.8 V | +0.2 V |

In Table 1, state 1 corresponds to a first reception period when a signal is supplied from the first reception terminal 520, state 2 corresponds to a second reception period when a signal is supplied from the second reception terminal 521, state 3 corresponds to a first transmission period when a transmission signal is supplied from the first transmission terminal 510, and state 4 corresponds to a second transmission period when a transmission signal is supplied from the second transmission terminal 511.

Incidentally, a voltage of 4.8 V is also applied to the FETs for reception in order to make them turn off upon transmission. Even when the voltage of 4.8 V is applied to the FETs for reception, electric power which passes through the FETs is extremely small when the FETs for reception turn on, so that a waveform is not rounded like the FETs for transmission. A waveform is rounded only when the electric power is large (about 20 dBm or more).

Thus, in this embodiment, a voltage corresponding to a logical-OR of the voltages of the first and second control terminals for transmission 610 and 611 and the voltage of the reference voltage terminal 660 are applied to drain-source terminals of the FETs 101 through 116, and 5 V is applied upon transmission, and 3 V is applied upon reception. Accordingly, although the voltage applied to gate-drain and gate-source of the FETs for transmission 101 through 108 is −4.8 V upon transmission, it is decreased to −2.8 V except on transmission, so that it is possible to avoid a phenomenon that the FETs for transmission 101 through 104, and 105 through 108 become hard to turn on.

Moreover, the bias voltage of 5 V is applied to the FETs for reception 109 through 116 when the transmission signal is supplied, thereby enabling to achieve superior distortion characteristics. The reason is as follows. That is, if either of the FETs 105 through 108, 109 through 112, and 113 through 116 which should be turned off is turned on, the signal waveform is distorted and the harmonic content will be generated. In order to prevent this, it is necessary to make the bias voltage high when a large electric power signal is supplied.

In addition, even when the voltage of 4.8 V is applied to the FETs for reception upon transmission, problems may not be created in a rising edge of a waveform upon reception. It is because the electric power which passes through the FETs is extremely small when the FETs for reception turn on, so that the waveform is not rounded like the FETs for transmission. A waveform is rounded only when the electric power is large (about 20 dBm or more).

Incidentally, the resistance element 282 is effective also in order to discharge a charge, thereby making it possible to quickly switch the potential of point B from 4.8 V upon transmission to 2.8 V upon reception.

Incidentally, since the gate-source and the gate-drain of each of the FETs 101 through 116 have a symmetrical structure, the same characteristics are obtained even when the connections to the drain and the source are changed.

Figure 3:
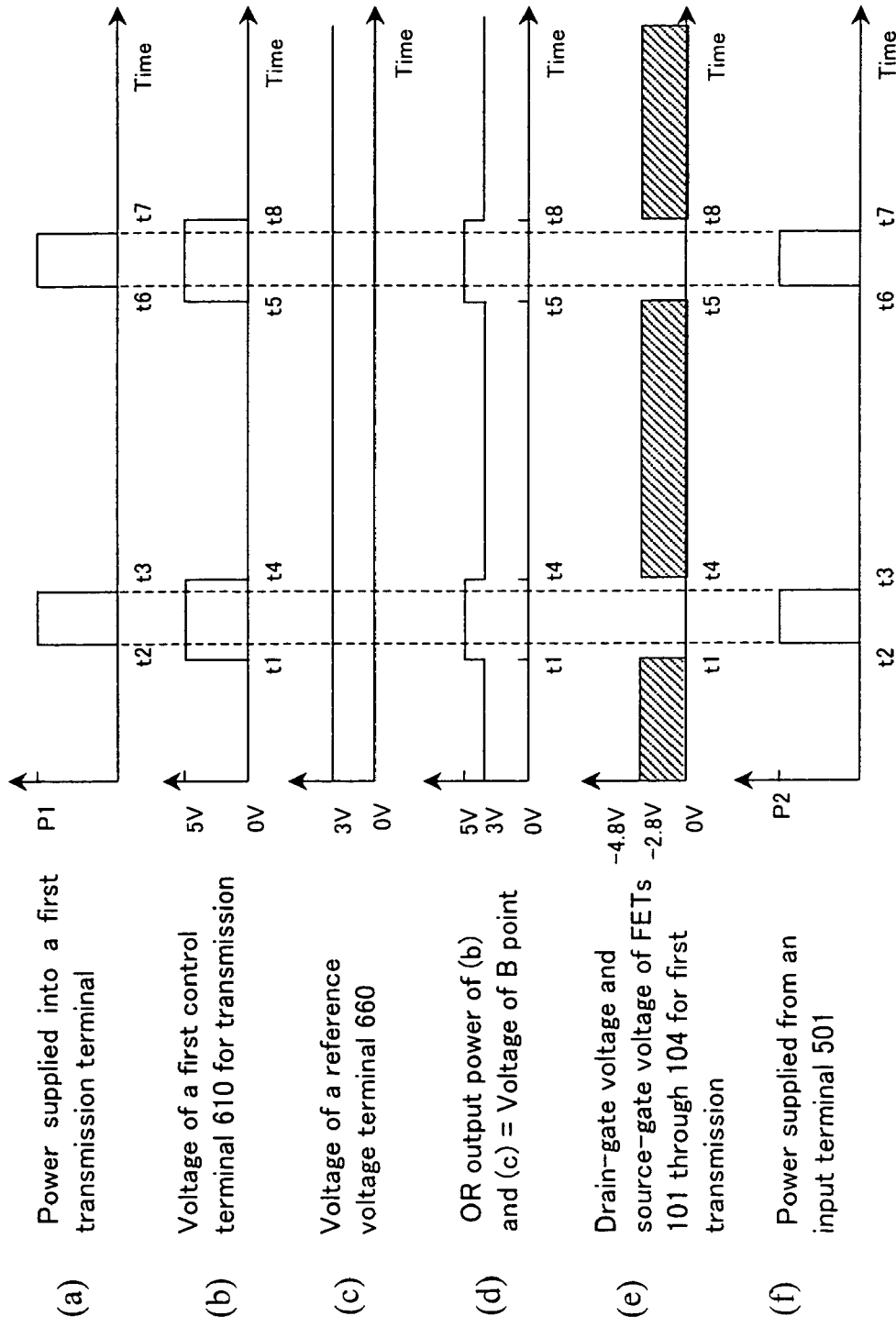
FIG. 3 is a timing chart showing signal timing of the high frequency switching circuit of the second embodiment of the present invention.

The relationship between the timing of the signal and the voltage in the high frequency switching circuit in FIG. 2 is shown in FIG. 3.

FIG. 3(*a*) shows a timing chart of electric power supplied to the first transmission terminal 510. This timing assumes a communication mode of a time division multiple access (TDMA) For example, in the case of a GSM mode, one slot is assigned to transmission and reception, respectively, for a terminal among time slots separated into eight slots, and a span of each slot is 577 microseconds. There is shown a situation in FIG. 3 as an example where after performing transmission between time t2 and time t3, reception is performed at either slot between time t3 and time t6, and transmission is performed again between time t6 and time t7.

FIG. 3(*b*) shows a timing chart of a voltage (first transmission control signal) of the first control terminal for transmission 610. Specifically, there is shown a situation where the FETs for transmission 101 through 104 are turned on before transmission is performed (time t1), and after the transmission is completed (time t4), the FETs for transmission 101 through 104 are turned off.

FIG. 3(*c*) shows a chart of the voltage of the reference voltage terminal 660.

FIG. 3(*d*) shows a chart of a logical-OR voltage of the voltage of the first control terminal for transmission 610 shown in FIG. 3(*b*) and the voltage of the reference voltage terminal 660 shown in FIG. 3(*c*).

As shown in FIG. 3(*d*), 5 V is applied only upon transmission, and 3 V is applied except that time as the drain-source bias of the first FETs for transmission 101 through 104 in FIG. 2, in other words, the voltage is applied synchronizing with transmission and reception of the high frequency signal, so that the voltage of the drain-gate and the source-gate of each of the FETs 101 through 104 can be reduced as shown in FIG. 3(*e*).

In FIG. 3(*e*), a slash portion shows a product of the bias voltage of the FETs 101 through 104 and the time (bias voltage and time product), and the smaller the area is, the further the waveform can hardly be rounded. The bias voltage and time product of this embodiment is reduced by ⅗ of that of the conventional example, thereby being able to exhibit a superior effect.

FIG. 3(*f*) shows a chart of the electric power supplied from the input/output terminal 501.

Incidentally, symbol P1 in FIG. 3(*a*) shows input power, symbol P2 in FIG. 3(*f*) shows output power, and (P1−P2) is equivalent to insertion loss of the high frequency switching circuit.

Although the reference voltage is supplied to the OR circuit in the embodiment described above, the input of the reference voltage may be omitted.

(Third Embodiment)

Figure 4:
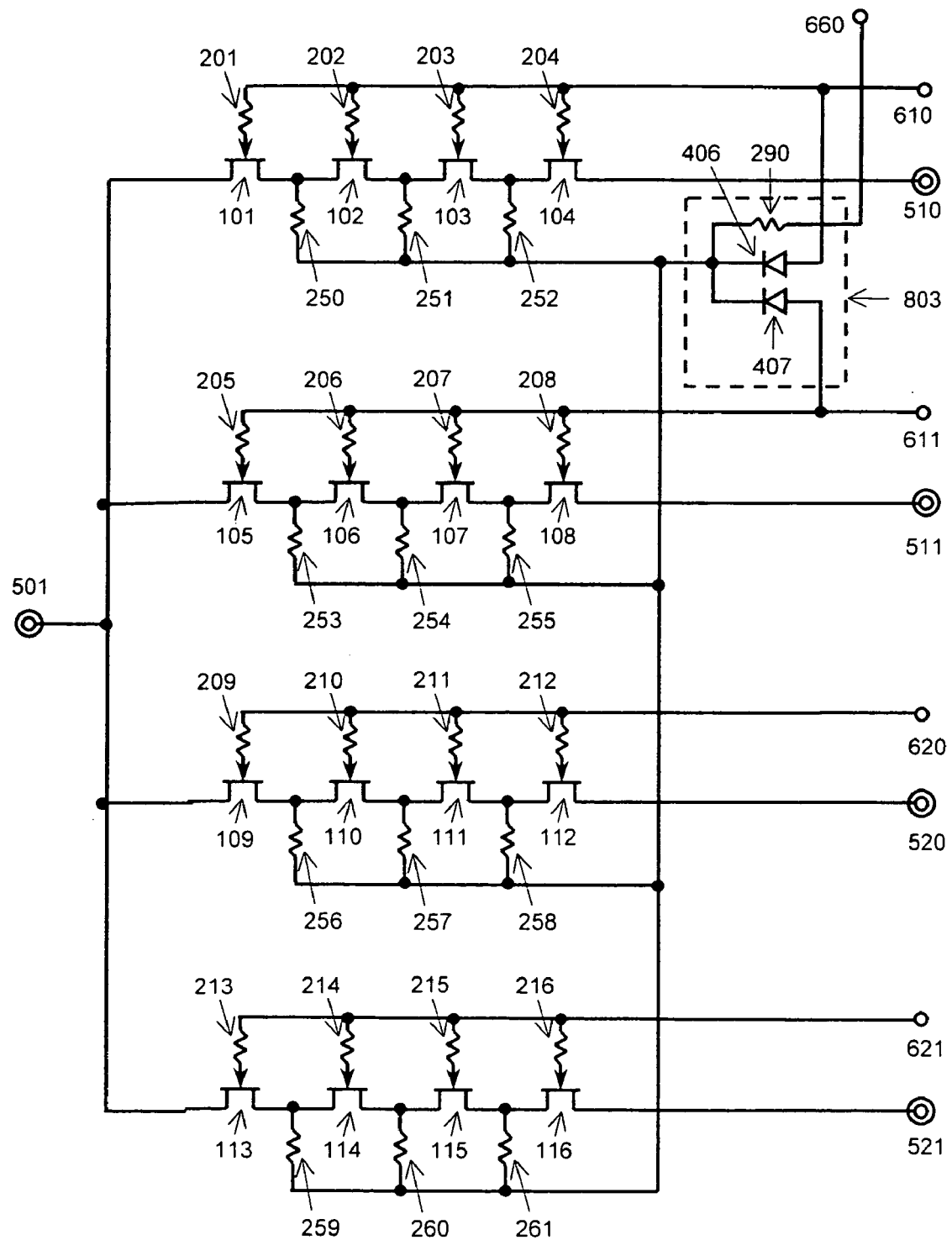
FIG. 4 is a circuit diagram showing an equivalent circuit of a high frequency switching circuit of a third embodiment of the present invention.

FIG. 4 shows a configuration of a high frequency switching circuit of a third embodiment of the present invention. In FIG. 4, reference numerals 101 through 116 represent FETs which configure four switching circuit sections. Reference numerals 201 through 216 represent resistance elements. Reference numerals 250 through 261 represent resistance elements. Reference numeral 290 represents a resistance element. Reference numerals 406 and 407 represent diodes which configure an OR circuit. Reference numeral 501 represents an input/output terminal connected to, for example an antenna. Reference numeral 510 represents a first transmission terminal connected to a first transmitting circuit section. Reference numeral 511 represents a second transmission terminal connected to a second transmitting circuit section. Reference numeral 520 represents a first reception terminal connected to a first receiving circuit section. Reference numeral 521 represents a second reception terminal connected to a second receiving circuit section. Reference numeral 610 represents a first control terminal for transmission. Reference numeral 611 represents a second control terminal for transmission. Reference numeral 620 represents a first control terminal for reception. Reference numeral 621 represents a second control terminal for reception. Reference numeral 660 represents a reference voltage terminal. Reference numeral 803 represents an OR circuit.

The operation of the high frequency switching circuit configured as shown in FIG. 4 described above is almost similar to that of the second embodiment except following points. That is, it is different in that the diode 403 is used in order to supply the reference voltage in the second embodiment, as opposed to that, the resistance element 290 is used in order to supply the reference voltage in the third embodiment. According to this configuration, a current flowing from the transmission control terminals 610 and 611 or the reference voltage terminal 660 via the resistance element 281 to the earth is reducible, and a high frequency switching circuit which has low current consumption and provide an equivalent effect can be achieved.

Although the reference voltage is supplied to the OR circuit in the embodiment described above, the input of the reference voltage may be omitted.

(Fourth Embodiment)

Figure 5:
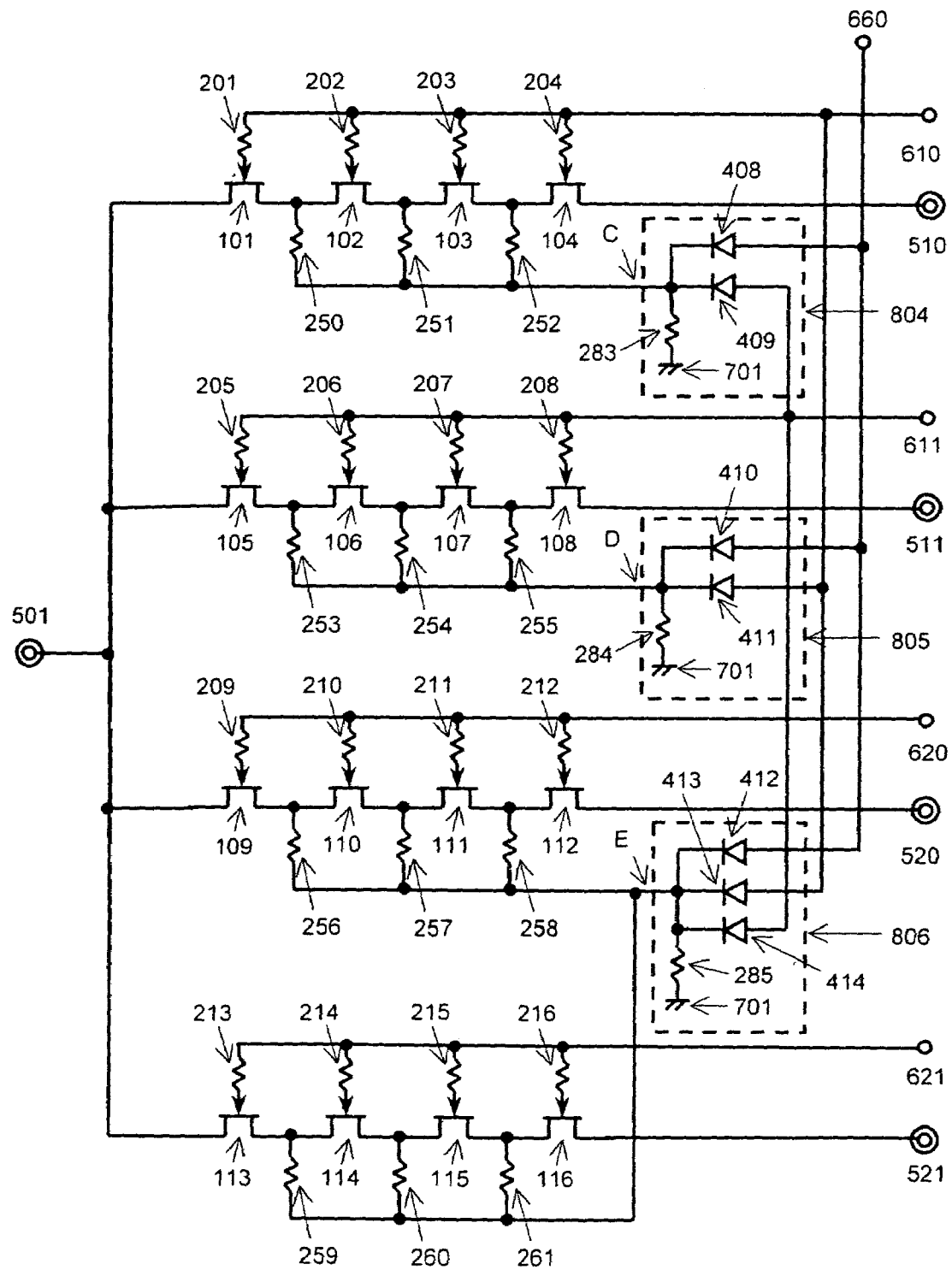
FIG. 5 is a circuit diagram showing an equivalent circuit of a high frequency switching circuit of a fourth embodiment of the present invention.

FIG. 5 represents a configuration of a high frequency switching circuit of a fourth embodiment of the present invention. In FIG. 5, reference numerals 101 through 116 represent FETs which configure four switching circuit sections. Reference numerals 201 through 216 represent resistance elements. Reference numerals 250 through 261 represent resistance elements. Reference numerals 283 through 285 represent resistance elements. Reference numerals 408 through 414 represent diodes which configure OR circuits. Reference numeral 501 represents an input/output terminal connected to, for example an antenna. Reference numeral 510 represents a first transmission terminal connected to a first transmitting circuit section. Reference numeral 511 represents a second transmission terminal connected to a second transmitting circuit section. Reference numeral 520 represents a first reception terminal connected to a first receiving circuit section. Reference numeral 521 represents a second reception terminal connected to a second receiving circuit section. Reference numeral 610 represents a first control terminal for transmission. Reference numeral 611 represents a second control terminal for transmission. Reference numeral 620 represents a first control terminal for reception. Reference numeral 621 represents a second control terminal for reception. Reference numeral 660 represents a reference voltage terminal. Reference numeral 701 represents an earth. Reference numerals 804 through 806 represent OR circuits.

Hereinafter, description will be made of the operation of the high frequency switching circuit configured as shown in FIG. 5 described above.

A fundamental transmission operation and a reception operation are similar to those of the second embodiment, and the following points are different from those of the second embodiment. Specifically, three logical circuits 804, 805, and 806 and how to supply a bias voltage are different from those of the second embodiment.

Inputs of the OR circuit 804 are voltages of the second control terminal for transmission 611 and the reference voltage terminal 660, and a voltage corresponding to a logical-OR of each terminal voltage of the second control terminal for transmission 611 and the reference voltage terminal 660 is supplied to point C which is an output of the OR circuit 804. The relationship between the input voltage and the output voltage of the logical circuit 804 is shown in Table 2.

TABLE 2

| State | Input voltage | | | | | Output voltage of point C | Gate-source voltage and gate-drain voltage of FETs 101 through 104 |
|---|---|---|---|---|---|---|---|
| | Voltage of the control terminal 610 | Voltage of the control terminal 611 | Voltage of the reference voltage terminal 660 | Voltage of the control terminal 620 | Voltage of the control terminal 621 | | |
| 1 | 0 V | 0 V | 3 V | 3 V | 0 V | 2.8 V | −2.8 V |
| 2 | 0 V | 0 V | 3 V | 0 V | 3 V | 2.8 V | −2.8 V |
| 3 | 5 V | 0 V | 3 V | 0 V | 0 V | 4.8 V | +0.2 V |
| 4 | 0 V | 5 V | 3 V | 0 V | 0 V | 4.8 V | −4.8 V |

Inputs of the OR circuit 805 are voltages of the first control terminal for transmission 610 and the reference voltage terminal 660, and a voltage corresponding to a logical-OR of each terminal voltage of the first control terminal for transmission 610 and the reference voltage terminal 660 is supplied to point D which is an output of the OR circuit. The relationship between the input voltage and the output voltage of the logical circuit 805 is shown in Table 3.

TABLE 3

| State | Input voltage | | | | | Output voltage of point D | Gate-source voltage and gate-drain voltage of FETs 105 through 108 |
| | Voltage of the control terminal 610 | Voltage of the control terminal 611 | Voltage of the reference voltage terminal 660 | Voltage of the control terminal 620 | Voltage of the control terminal 621 | | |
|---|---|---|---|---|---|---|---|
| 1 | 0 V | 0 V | 3 V | 3 V | 0 V | 2.8 V | −2.8 V |
| 2 | 0 V | 0 V | 3 V | 0 V | 3 V | 2.8 V | −2.8 V |
| 3 | 5 V | 0 V | 3 V | 0 V | 0 V | 4.8 V | −4.8 V |
| 4 | 0 V | 5 V | 3 V | 0 V | 0 V | 4.8 V | +0.2 V |

Inputs of the OR circuit 806 are voltages of the first and second control terminals for transmission 610 and 611 and the reference voltage terminal 660, and a voltage corresponding to a logical-OR of each terminal voltage of the first and second control terminals for transmission 611 and 610, and the reference voltage terminal 660 is supplied to point E which is an output of the OR circuit 806. The relationship between the input voltage and the output voltage of the logical circuit 806 is shown in Table 4.

TABLE 4

| State | Input voltage | | | | | Output voltage of point E | Gate-source voltage and gate-drain voltage of FETs 109 through 112 | Gate-source voltage and gate-drain voltage of FETs 113 through 116 |
| | Voltage of the control terminal 610 | Voltage of the control terminal 611 | Voltage of the reference voltage terminal 660 | Voltage of the control terminal 620 | Voltage of the control terminal 621 | | | |
|---|---|---|---|---|---|---|---|---|
| 1 | 0 V | 0 V | 3 V | 3 V | 0 V | 2.8 V | +0.2 V | −2.8 V |
| 2 | 0 V | 0 V | 3 V | 0 V | 3 V | 2.8 V | −2.8 V | +0.2 V |
| 3 | 5 V | 0 V | 3 V | 0 V | 0 V | 4.8 V | −4.8 V | −4.8 V |
| 4 | 0 V | 5 V | 3 V | 0 V | 0 V | 4.8 V | −4.8 V | −4.8 V |

In Table 2 through Table 4, state 1 corresponds to a first reception period when a signal is supplied from the first reception terminal 520, state 2 corresponds to a second reception period when a signal is supplied from the second reception terminal 521, state 3 corresponds to a first transmission period when a transmission signal is supplied from the first transmission terminal 510, and state 4 corresponds to a second transmission period when a transmission signal is supplied from the second transmission terminal 511. Incidentally, a typical power supply voltage is used as the reference voltage in this embodiment.

For example, when transmitting from the transmission terminal 510, a ratio of resistance values of the resistance elements 201 through 204, and resistance values of the resistance elements 250 through 252, and the resistance element 283 is determined so that a voltage between gate-source of each of the FETs 101 through 104 in state 3 may become about +0.5 V. Thus, optimum forward bias conditions can be set to the FETs 101 through 104.

A forward bias voltage is set as +0.5 V in this embodiment, so that on-resistance of the FET is reduced, thereby enabling to achieve further low insertion loss. Also when transmitting from the transmission terminal 511, low insertion loss can be achieved in a similar way.

Incidentally, biasing the FETs for reception 109 through 116 is similar to that of the second embodiment, and a bias voltage of 5 V is applied thereto when a transmission signal is supplied, thereby enabling to achieve superior distortion characteristics.

Thus, in this embodiment, the FETs for transmission can be forward-biased upon transmission with hardly increasing current consumption, thereby achieving the high frequency switching circuit with low insertion loss and low current consumption.

Incidentally, the resistance elements 283 through 285 are effective also in order to discharge a charge, thereby making it possible to quickly switch the potential of point C through point E from 4.8 V upon transmission to 2.8 V upon reception.

Although the reference voltage is supplied to the OR circuit in the embodiment described above, the input of the reference voltage may be omitted.

(Fifth Embodiment)

Figure 6:
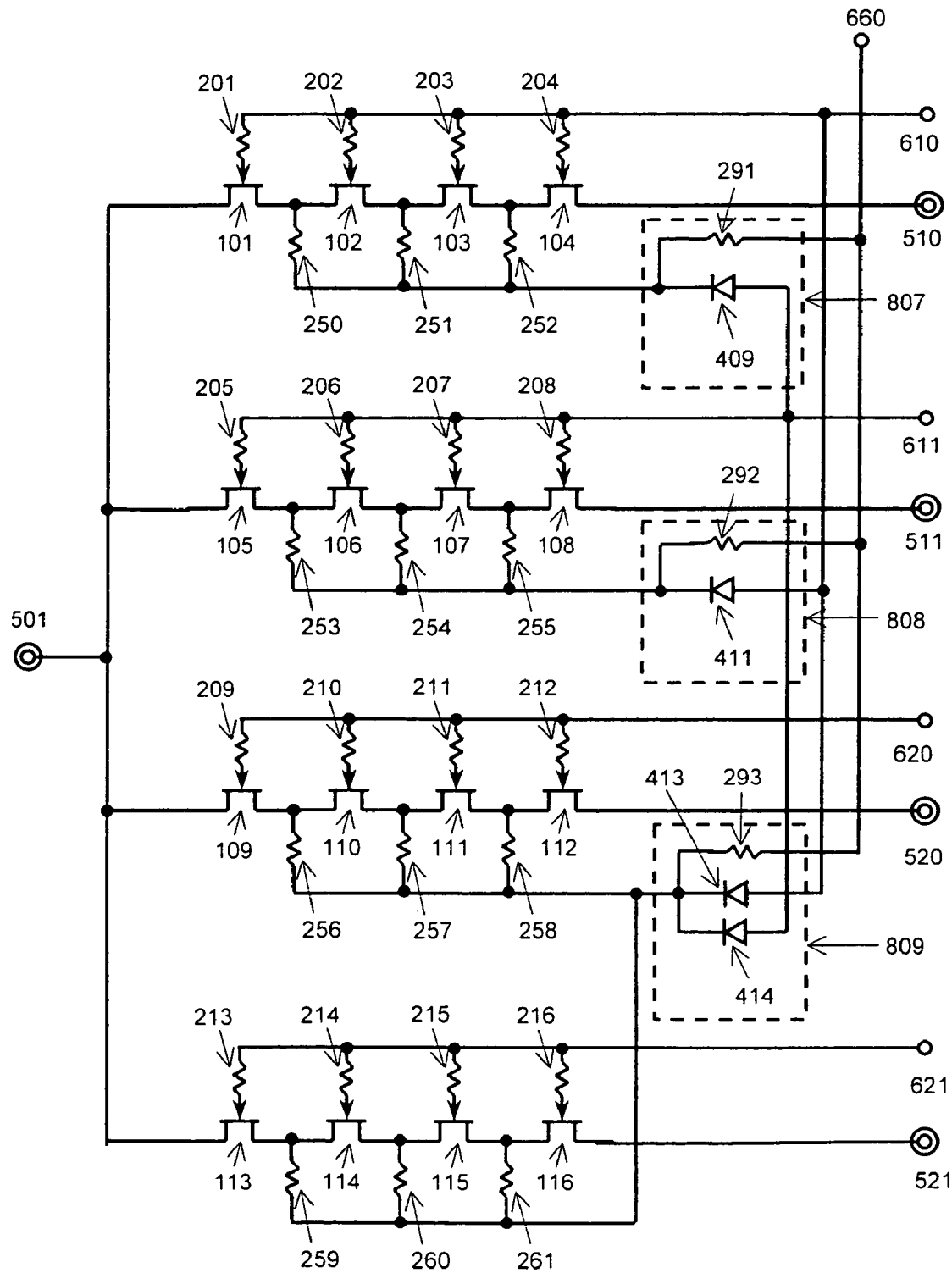
FIG. 6 is a circuit diagram showing an equivalent circuit of a high frequency switching circuit of a fifth embodiment of the present invention.

FIG. 6 shows a configuration of a high frequency switching circuit of a fifth embodiment of the present invention. In FIG. 6, reference numerals 101 through 116 represent FETs which configure four switching circuit sections. Reference numerals 201 through 216 represent resistance elements. Reference numerals 250 through 261 represent resistance elements. Reference numerals 291 through 293 represent resistance elements. Reference numerals 409, 411, 413, and 414 represent diodes which configure OR circuits. Reference numeral 501 represents an input/output terminal connected to, for example an antenna. Reference numeral 510 represents a first transmission terminal connected to a first transmitting circuit section. Reference numeral 511 represents a second transmission terminal connected to a second transmitting circuit section. Reference numeral 520 represents a first reception terminal connected to a first receiving circuit section. Reference numeral 521 represents a second reception terminal connected to a second receiving circuit section. Reference numeral 610 represents a first control terminal for transmission. Reference numeral 611 represents a second control terminal for transmission. Reference numeral 620 represents a first control terminal for reception. Reference numeral 621 represents a second control terminal for reception. Reference numeral 660 represents a reference voltage terminal. Reference numerals 807 through 809 represent OR circuits.

Although the operation and the effect of the high frequency switching circuit configured as shown in FIG. 6 described above are similar to those of the fourth embodiment, it is different in that the diodes 408, 410, and 412 are used in order to supply the reference voltage in the fourth embodiment, as opposed to that, the resistance elements 291, 292, and 293 are used in order to supply the reference voltage in the fifth embodiment.

According to this configuration, a current flowing from the transmission control terminals 610 and 611 or the reference voltage terminal 660 via the resistance elements 283 through 285 to the earth is reducible, thereby achieving the high frequency switching circuit with low current consumption.

Although the reference voltage is supplied to the OR circuit in the embodiment described above, the input of the reference voltage may be omitted.

(Sixth Embodiment)

Figure 7:
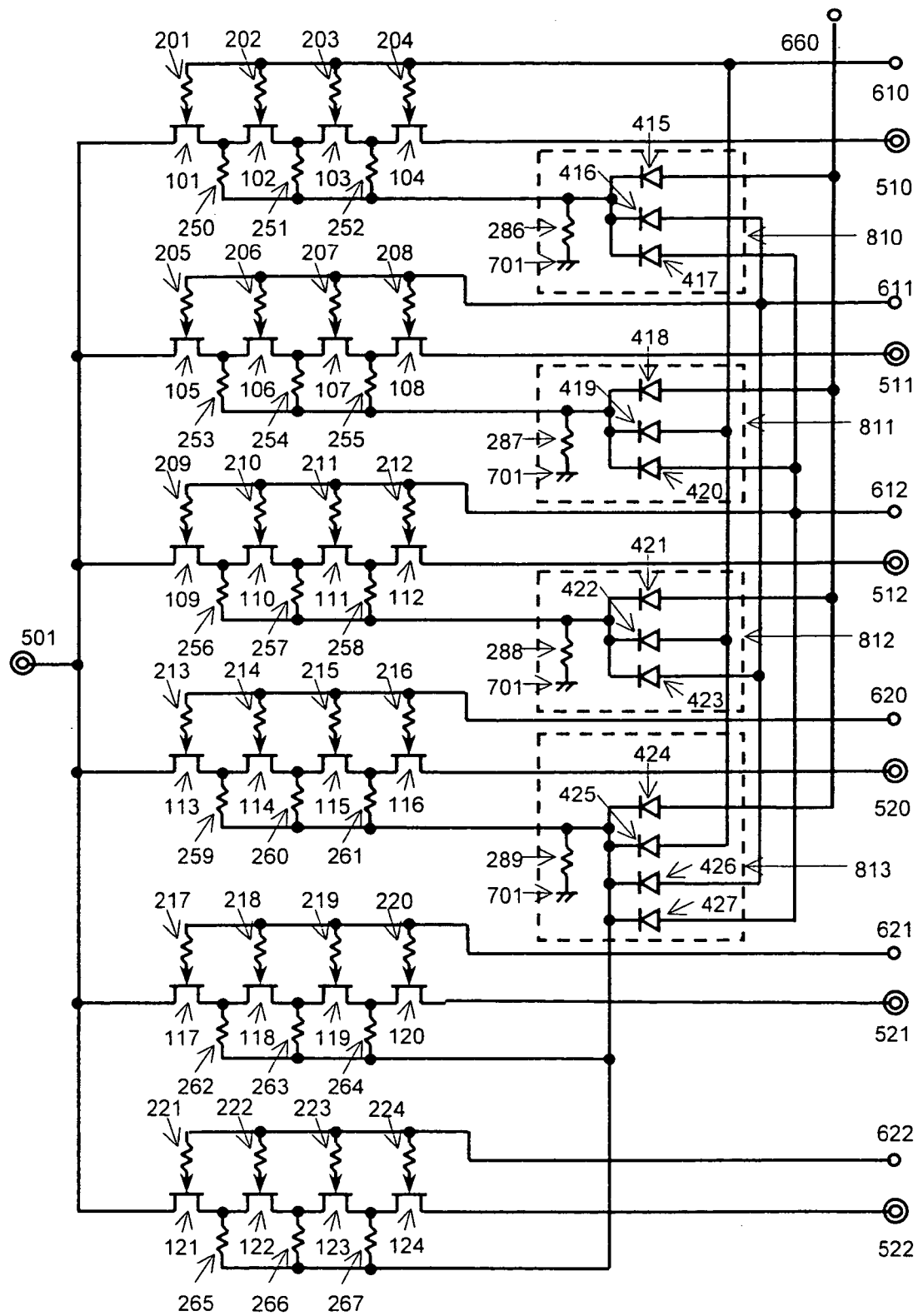
FIG. 7 is a circuit diagram showing an equivalent circuit of a high frequency switching circuit of a sixth embodiment of the present invention.

FIG. 7 shows a configuration of a high frequency switching circuit of a sixth embodiment of the present invention. In FIG. 7, reference numerals 101 through 124 represent FETs which configure six switching circuit sections. Reference numerals 201 through 224 represent resistance elements. Reference numerals 250 through 267 represent resistance elements. Reference numerals 286 through 289 represent resistance elements. Reference numeral 501 represents an input/output terminal connected to, for example an antenna. Reference numeral 510 represents a first transmission terminal connected to a first transmitting circuit section. Reference numeral 511 represents a second transmission terminal connected to a second transmitting circuit section. Reference numeral 512 represents a third transmission terminal connected to a third transmitting circuit section. Reference numeral 520 represents a first reception terminal connected to a first receiving circuit section. Reference numeral 521 represents a second reception terminal connected to a second receiving circuit section. Reference numeral 522 represents a third reception terminal connected to a third receiving circuit section. Reference numeral 610 represents a first control terminal for transmission. Reference numeral 611 represents a second control terminal for transmission. Reference numeral 612 represents a third control terminal for transmission. Reference numeral 620 represents a first control terminal for reception. Reference numeral 621 represents a second control terminal for reception. Reference numeral 622 represents a third control terminal for reception. Reference numeral 660 represents a reference voltage terminal. Reference numerals 415 through 427 represent diode which configure OR circuits. Reference numeral 701 represents an earth.

Although a fundamental transmission operation and a fundamental reception operation of the high frequency switching circuit configured as shown in FIG. 7 are similar to those of the fourth embodiment, the configuration shown in FIG. 7 corresponds also to a system provided with the transmission terminals and reception terminals with three channels.

The effect of this embodiment is similar to that of the fourth embodiment.

Although the reference voltage is supplied to the OR circuit in the embodiment described above, the input of the reference voltage may be omitted.

(Seventh Embodiment)

Figure 8:
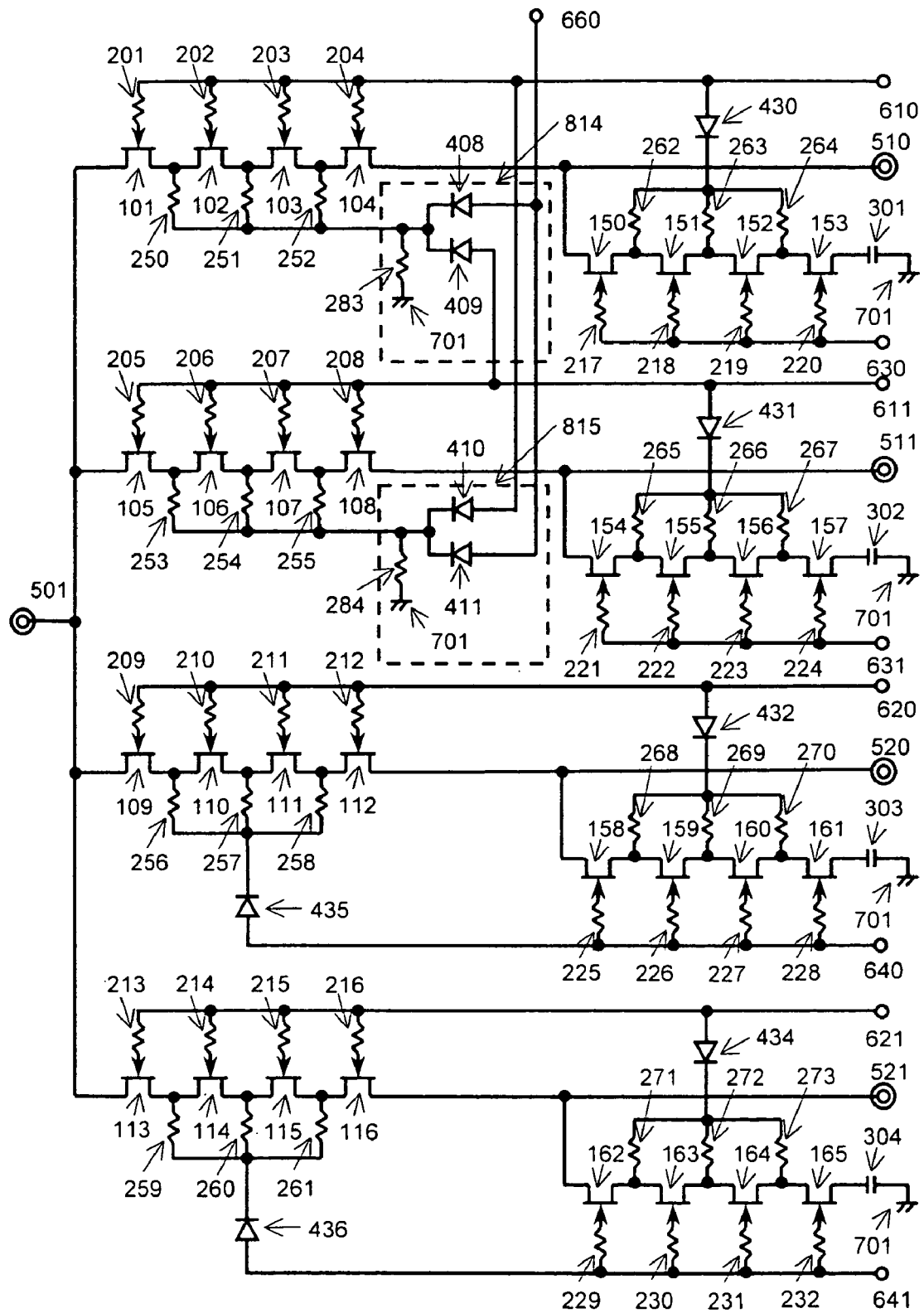
FIG. 8 is a circuit diagram showing an equivalent circuit of a high frequency switching circuit of a seventh embodiment of the present invention.

FIG. 8 represents a configuration of a high frequency switching circuit of a seventh embodiment of the present invention. In FIG. 8, reference numerals 101 through 116 represent FETs which configure four switching circuit sections. Reference numerals 150 through 165 represent FETs which configure four switching circuit sections for shunt. Reference numerals 201 through 232 represent resistance elements. Reference numerals 250 through 273 represent resistance elements. Reference numerals 283 and 284 represent resistance elements. Reference numerals 301 through 304 represent capacitors. Reference numerals 408 through 411 represent diodes which configure OR circuits. Reference numeral 430 through 432, and 434 through 436 represent diodes. Reference numeral 501 represents an input/output terminal connected to, for example an antenna. Reference numeral 510 represents a first transmission terminal connected to a first transmitting circuit section. Reference numeral 511 represents a second transmission terminal connected to a second transmitting circuit section. Reference numeral 520 represents a first reception terminal connected to a first receiving circuit section. Reference numeral 521 represents a second reception terminal connected to a second receiving circuit section. Reference numeral 610 represents a first control terminal for transmission. Reference numeral 611 represents a second control terminal for transmission. Reference numeral 620 represents a first control terminal for reception. Reference numeral 621 represents a second control terminal for reception. Reference numerals 630 and 631 represent shunt control terminals. Reference numerals 640 and 641 represent shunt control terminals. Reference numeral 660 represents a reference voltage terminal. Reference numeral 701 represents an earth. Reference numerals 814 and 815 represent OR circuits.

In a configuration shown in FIG. 8, a drain control voltage is supplied to switching circuit sections comprising the FETs 101 through 104, and the FETs 105 through 108, respectively, from the OR circuit sections 814 and 815 respectively. However, voltages with opposite phases to the gate control voltages are supplied to drain or source of FETs 109 through 112 and FETs 113 through 116 which configure switching circuit sections other than those via the diode 435,436, or to drains or sources of the FETs 150 through 153, the FETs 154 through 157, the FETs 158 through 161, and the FETs 162 through 165 which configure shunt switching circuit sections via the diodes 430 through 432, and 434, instead of supplying the drain control voltages from the OR circuit sections.

In particular, gate control voltages of the FETs 158 through 161 and the FETs 162 through 166 which configure the shunt switching circuit sections are supplied via the diodes 435 and 436 to the drains or the source of the FETs 109 through 112 and the FETs 113 through 116 which configure the switching circuit sections.

Hereinafter, description will be made of the operation of the high frequency switching circuit configured as shown in FIG. 8 described above.

Although a fundamental operation of the high frequency switching circuit in FIG. 8 is similar to that of the first embodiment, it is different in that a circuit called a shunt circuit is provided to each transmission terminal and each reception terminal. The shunt circuits consist of four FETs of 150 through 153, 154 through 157, 158 through 161, and 162 through 165 connected in series, respectively, in the illustrated embodiment. Those one ends are connected to the first transmission terminal 510, the second transmission terminal 511, the first reception terminal 520, and the second reception terminal 521, respectively, and opposite ends are grounded via capacitors 301 through 304.

In addition, four shunt switching circuit sections are made to perform reverse operations to the operations of the corresponding switching circuit sections connected between the first transmission terminal 510, the second transmission terminal 511, the first reception terminal 520, and the second reception terminal 521, and the input/output terminal 501, respectively, so that isolation of the transmission terminal or the reception terminal which does not contribute to an input/output can be improved.

When a signal supplied from the first transmission terminal 510 is supplied to the input/output terminal 501, 5 V is applied to the first control terminal for transmission 610 and the shunt control terminals 631, 640, and 641 as a high-level voltage, and 0 V is applied to the second control terminal for transmission 611, the first and second control terminals for reception 620 and 621, and the shunt control terminal 630 as a low-level voltage.

Consequently, the FETs 101 through 104 turn on, so that the transmission terminal 510 and the input/output terminal 501 are connected with a low resistance and then the transmission signal is supplied from the first transmission terminal 510 to the input/output terminal 501, and the shunt FETs 154 through 165 turn on, thereby obtaining high isolation.

A voltage corresponding to a logical-OR of the reference voltage from the reference voltage terminal 660 and the control voltage from the second control terminal for transmission 611 is applied as a drain-source bias of the FETs 101 through 104. In this case, only when transmitting from the second transmission terminal 511, a bias of 4.8 V is applied thereto, and a voltage of 2.8 V is applied thereto except that case.

Moreover, a voltage with opposite phase to the gate voltage is applied to the source-drain of each of the FETs for shunt 150 through 165 via the diodes 430 through 432, and 434, so that while high isolation with lower insertion loss can be achieved when they are on, superior distortion characteristics are achieved when they are off.

Similarly, when a signal supplied from the second transmission terminal 511 is supplied to the input/output terminal 501, 5 V is applied to the second control terminal for transmission 611 and the shunt control terminals 630, 640, and 641 as a high-level voltage, 0 V is applied to the first control terminal for transmission 610, the first and second control terminals for reception 620 and 621, and the shunt control terminal 631 as a low-level voltage. The FETs 105 through 109 turn on, so that the transmission terminal 511 and the input/output terminal 501 are connected with a low resistance and then a transmission signal is supplied from the second transmission terminal 511 to the input/output terminal 501, and the FETs 150 through 153, and 158 through 165 are turned on, thereby obtaining high isolation.

A voltage corresponding to a logical-OR of the reference voltage from the reference voltage terminal 660 and the control voltage from the first control terminal for transmission 610 is applied as a drain-source bias of the FETs 105 through 109. In this case, only when transmitting from the first transmission terminal 510, a bias of 4.8 V is applied thereto, and a voltage of 2.8 V is applied thereto except that case.

Moreover, when a signal supplied from the input/output terminal 501 is received by the first reception terminal 520, a high-level voltage 5 V is applied to the first control terminal for reception 620, and a low-level voltage 0 V is applied to the first and second control terminals for transmission 610 and 611, and the second control terminal for reception 621. Thus, the FETs 109 through 112 become an on-state, and other FETs become an off-state, so that the signal is received from the input/output terminal 501 through the first reception terminal 520.

A cathode of each of the diodes 430 through 432, and 434 through 436 is connected to source-drain of each of the FETs for reception 109 through 116, and the FETs for shunt 150 through 165 via the resistance elements for bias 256 through 273. An anode of each of the diodes 430 through 432, and 434 through 435 is connected to each of the first transmission control terminal 610, the second transmission control terminal 611, the first reception control terminal 620, the second reception control terminal 621, and the shunt control terminals 640 and 641, respectively.

Therefore, there can be reduced a forward current when each of the FETs 109 through 116, and 150 through 165 is forward-biased. The reason is as follows. That is, although current consumption of the circuit of this embodiment is determined by a forward current of the FET 109 through the FET 116, and the FET 150 through FET 165, and the diodes 430 through 432, and 434 through 435 connected backwardly are inserted in a path where the forward current flows, so that the forward current can be suppressed.

In this embodiment, although a voltage applied to gate-drain and gate-source of each of the FETs for transmission 101 through 108 is −5 V upon transmission, it is decreased to −3 V except upon transmission. Consequently, while a phenomenon that the FET for transmission becomes difficult to turn on can be avoided, the forward current of the FET to be turned on can be reduced.

Incidentally, the resistance elements 283 and 284 are effective also in order to discharge a charge, thereby making it possible for a voltage applied to the drain-source terminals of the FETs 101 through 108 to quickly be switched from 5 V upon transmission to 3 V upon reception.

Incidentally, the gate-source and the gate-drain of each of the FETs 101 through 116 have a symmetrical structure, so that the same characteristics are obtained even when connections between the drain and the source are changed.

Although the reference voltage is supplied to the OR circuit in the embodiment described above, the input of the reference voltage may be omitted.

(Eighth Embodiment)

Figure 9:
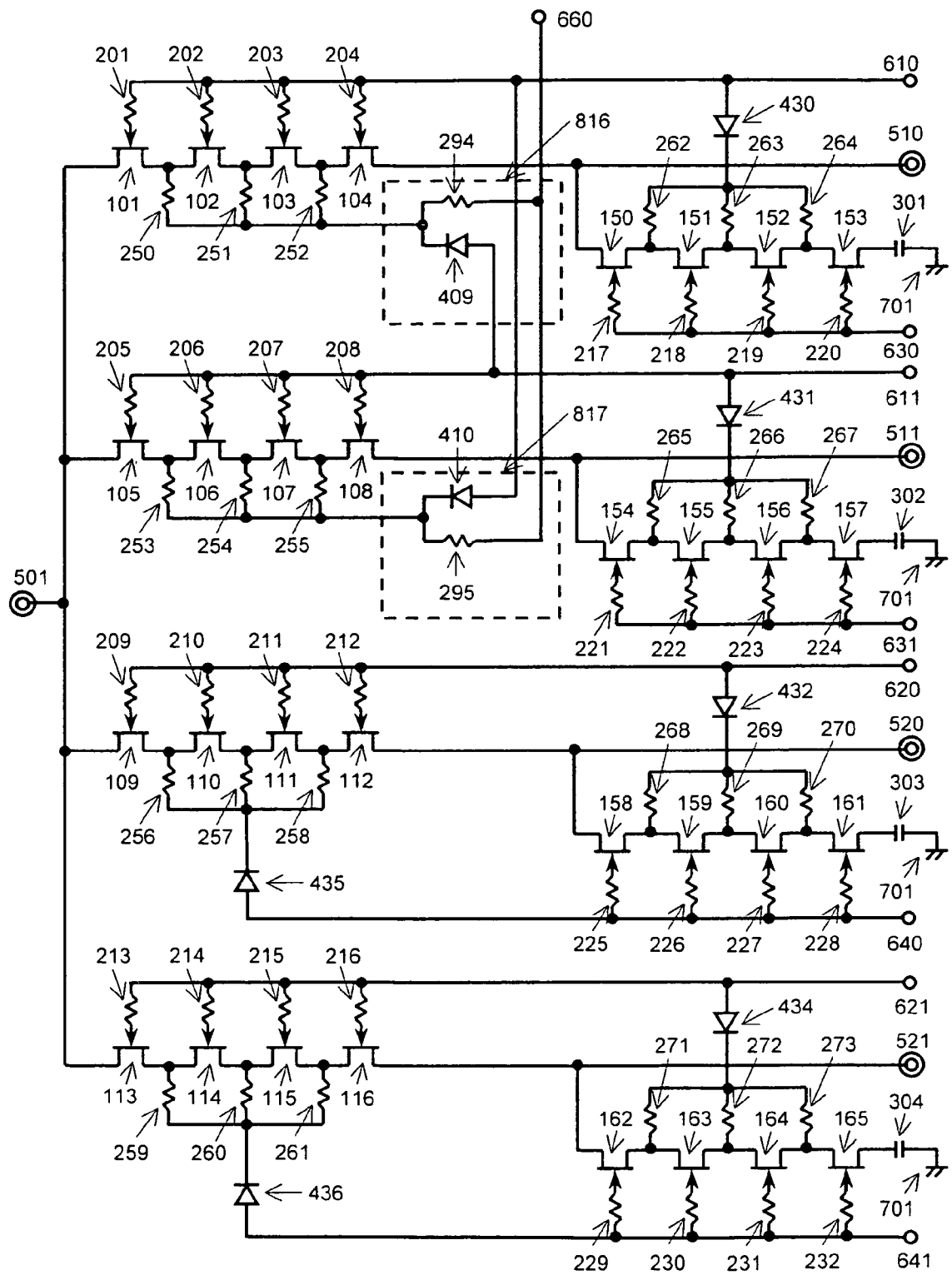
FIG. 9 is a circuit diagram showing an equivalent circuit of a high frequency switching circuit of an eighth embodiment of the present invention.
Figure 10:
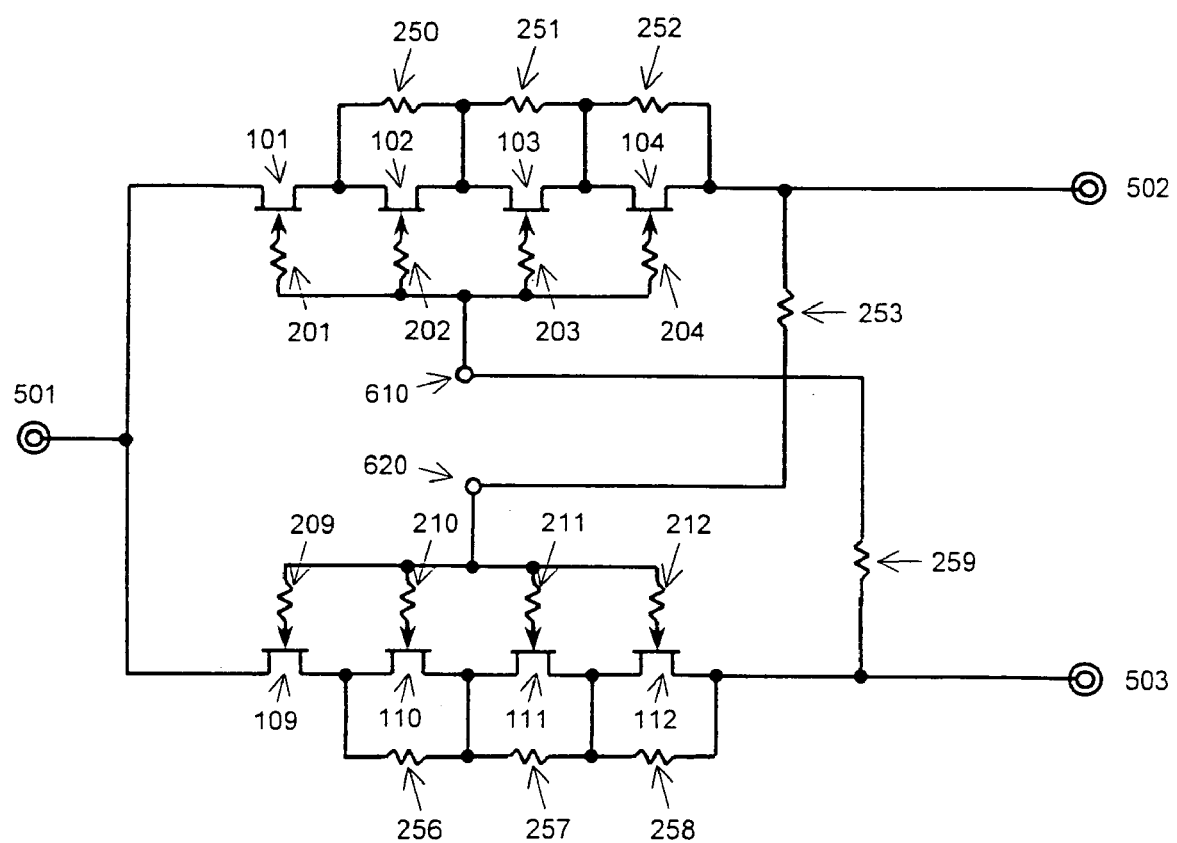
FIG. 10 is a circuit diagram showing an equivalent circuit of the conventional high frequency switching circuit.
Figure 11:
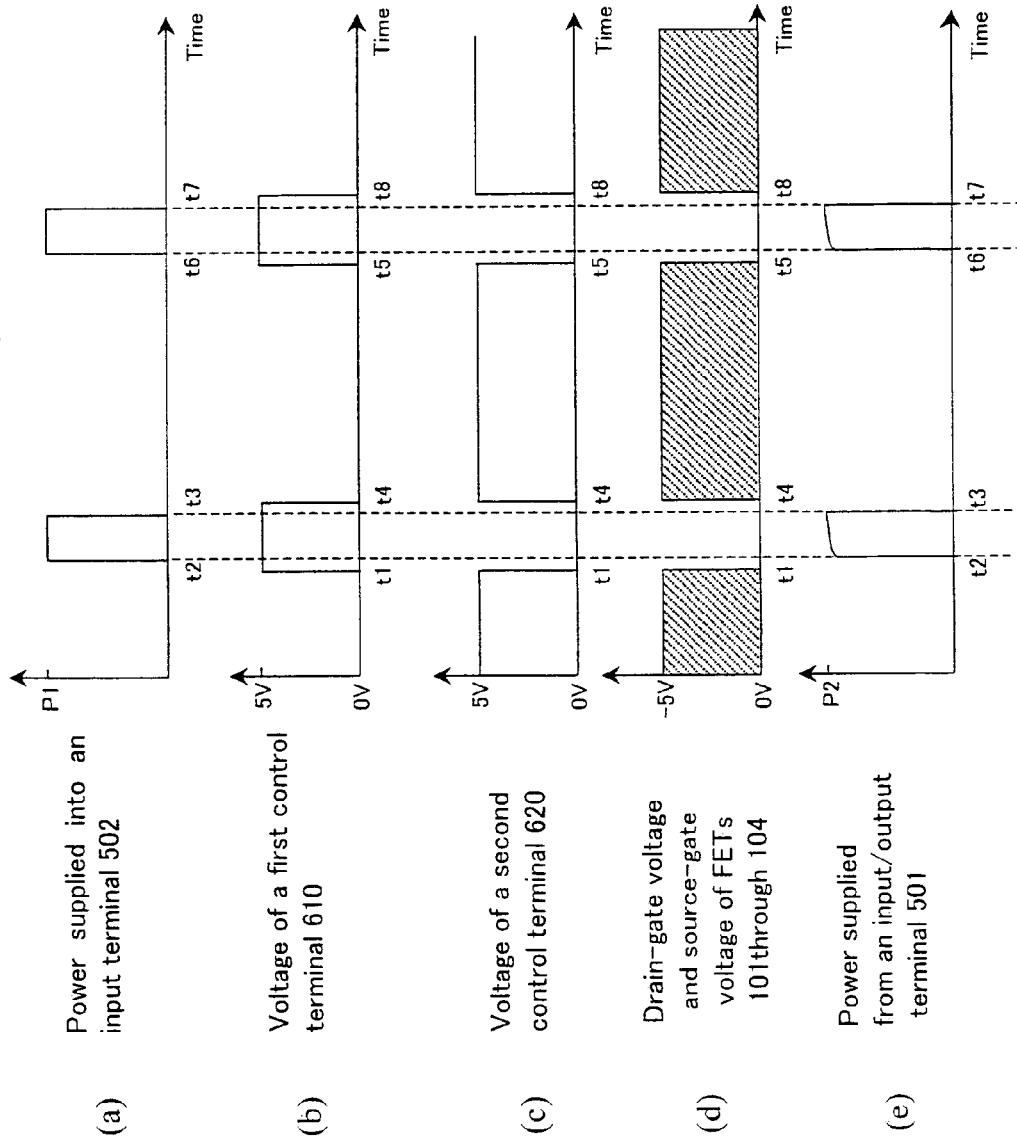
FIG. 11 is a timing chart showing signal timing of the conventional high frequency switching circuit.

FIG. 9 represents a configuration of a high frequency switching circuit of an eighth embodiment of the present invention. In FIG. 9, reference numerals 101 through 116 represent FETs which configure four switching circuit sections. Reference numerals 150 through 165 represent FETs which configure four switching circuit sections for shunt. Reference numerals 201 through 216 represent resistance elements. Reference numerals 250 through 273 represent resistance elements. Reference numerals 294 through 295 represent resistance elements. Reference numerals 301 through 304 represent capacitors. Reference numerals 409 and 410 represent diodes which configure OR circuits. Reference numeral 430 through 432, and 434 through 436 represent diodes. Reference numeral 501 represents an input/output terminal connected to, for example an antenna. Reference numeral 510 represents a first transmission terminal connected to a first transmitting circuit section. Reference numeral 511 represents a second transmission terminal connected to a second transmitting circuit section. Reference numeral 520 represents a first reception terminal connected to a first receiving circuit section. Reference numeral 521 represents a second reception terminal connected to a second receiving circuit section. Reference numeral 610 represents a first control terminal for transmission. Reference numeral 611 represents a second control terminal for transmission. Reference numeral 620 represents a first control terminal for reception. Reference numeral 621 represents a second control terminal for reception. Reference numeral 660 represents a reference voltage terminal. Reference numerals 816 and 817 represent OR circuits.

Although the operation and the effect of the high frequency switching circuit configured as shown in FIG. 9 described above are similar to those of the seventh embodiment, it is different in that the diodes 408 and 411 are used in order to supply the reference voltage in the seventh embodiment, as opposed to that, the resistance elements 294 and 295 are used in order to supply the reference voltage in the eighth embodiment.

According to this configuration, a current having flowed from the first and second control terminals for transmission 610 and 611, or the reference voltage terminal 660 via the resistance elements 283 and 284 to the earth in the seventh embodiment can be reduced, thereby achieving the high frequency switching circuit with low current consumption.

Although the circuits of the seventh and eighth embodiments described above are given by adding the shunt circuits to that of the first and second embodiments, it is possible to add the shunt circuit also to that of the third through the sixth embodiments similar to the above, and the effect by the shunt circuit described above is similar to that of the seventh and eighth embodiments.

It is the semiconductor device of the present invention that the high frequency switching circuits of each embodiment described above is integrated on the semiconductor substrate, and each of them provides the similar effect to the high frequency switching circuit of each embodiment.

Although the reference voltage is supplied to the OR circuit in the embodiment described above, the input of the reference voltage may be omitted.

Incidentally, although only one input/output terminal 501 connected to, for example the antenna has been arranged in the second through eighth embodiments, a plurality of input/output terminals may be provided. In this case, the switching circuit section will be respectively provided between a plurality of input/output terminals, and one or more transmission terminals and one or more reception terminals. It is similar to the shunt circuit section.

In the embodiments described above, a high voltage is applied upon transmission as a bias voltage of the FETs for transmission, and a low voltage is applied except that period, so that a superior high frequency switching circuit and a semiconductor device without a waveform to be rounded can be provided.

What is claimed is:

1. A high frequency switching circuit, comprising:
a plurality of switching circuit sections arranged between a plurality of input/output terminals which output and input a high frequency signal, wherein:
each of said plurality of switching circuit sections is comprised of a circuit consisting of a plurality of field effect transistors connected in series, and a gate control voltage is applied to gate terminals of said plurality of field effect transistors, so that an on-state and an off-state are achieved,
a drain control voltage is further applied to drain terminals or source terminals of said plurality of field effect transistors of each of said plurality of switching circuit sections,
a voltage according to an electric power value of the high frequency signal supplied to said plurality of switching circuit sections is supplied as said gate control voltage and said drain control voltage, and
the drain control voltage supplied to said plurality of switching circuit sections is a voltage given by a logical-OR of the gate control voltage supplied to said plurality of switching circuit sections.

2. A high frequency switching circuit, comprising:
a plurality of switching circuit sections arranged between a plurality of input/output terminals which output and input a high frequency signal, wherein:
each of said plurality of switching circuit sections is comprised of a circuit consisting of a plurality of field effect transistors connected in series, and a gate control voltage is applied to gate terminals of said plurality of field effect transistors, so that an on-state and an off-state are achieved,
a drain control voltage is further applied to drain terminals or source terminals of said plurality of field effect transistors of each of said plurality of switching circuit sections,
a voltage according to an electric power value of the high frequency signal supplied to said plurality of switching circuit sections is supplied as said gate control voltage and said drain control voltage, and
the drain control voltage supplied to said plurality of switching circuit sections is a voltage given by a logical-OR of the gate control voltage supplied to said plurality of switching circuit sections and said reference voltage supplied from an external source.

3. A high frequency switching circuit, comprising:
a plurality of switching circuit sections arranged between a plurality of input/output terminals which output and input a high frequency signal, wherein:
each of said plurality of switching circuit sections is comprised of a circuit consisting of a plurality of field effect transistors connected in series, and a gate control voltage is applied to gate terminals of said plurality of field effect transistors, so that an on-state and an off-state are achieved,
a drain control voltage is further applied to drain terminals or source terminals of said plurality of field effect transistors of each of said plurality of switching circuit sections,
a voltage according to an electric power value of the high frequency signal supplied to said plurality of switching circuit sections is supplied as said gate control voltage and said drain control voltage,
said plurality of switching circuit sections are circuits for switching transmission and reception of the high frequency signal, and
the drain control voltage is supplied to said plurality of switching circuit sections before the transmission and reception of said high frequency signal are performed and the voltage supply is terminated after the transmission and reception are completed.

4. A high frequency switching circuit, comprising:
a plurality of transmission terminals to which a high frequency signal is supplied;

a plurality of reception terminals from which the high frequency signal is supplied;

one or more input/output terminals which input or output the high frequency signal; and a plurality of switching circuit sections arranged between said plurality of transmission terminals and said one or more input/output terminals, and between said plurality of reception terminals and said one or more input/output terminals, wherein:

each of said plurality of switching circuit sections is comprised of a circuit having a plurality of field effect transistors connected in series, and a gate control voltage is applied to gate terminals of said plurality of field effect transistors, so that an on-state and an off-state are achieved, in said plurality of switching circuit sections, a voltage given by a logical-OR of gate control voltages of said plurality of switching circuit sections connected with said plurality of transmission terminals except a selected transmission terminal is further applied to a drain terminal or a source terminal of a selected switching circuit section between said selected transmission terminal to which a transmission signal is supplied among said plurality of transmission terminals and an input/output terminal as a drain control voltage, and a voltage given by a logical-OR of the gate control voltages of said plurality of switching circuit sections connected to said plurality of transmission terminals is applied to drain terminals or source terminals of field effect transistors of said plurality of switching circuit sections connected to said plurality of reception terminals as the drain control voltage.

5. A high frequency switching circuit, comprising:

a plurality of transmission terminals to which a high frequency signal is supplied;

a plurality of reception terminals from which the high frequency signal is supplied;

one or more input/output terminals which input or output the high frequency signal; and a plurality of switching circuit sections arranged between said plurality of transmission terminals and said one or more input/output terminals, and between said plurality of reception terminals and said one or more input/output terminals, wherein:

each of said plurality of switching circuit sections is comprised of a circuit having a plurality of field effect transistors connected in series, and a gate control voltage is applied to gate terminals of said plurality of field effect transistors, so that an on-state and an off-state are achieved, in said plurality of switching circuit sections, a voltage given by a logical-OR of a reference voltage and gate control voltages of the plurality of switching circuit sections connected with said plurality of transmission terminals except a selected transmission terminal is further applied to a drain terminal or a source terminal of a selected switching circuit section between said selected transmission terminal to which a transmission signal is supplied among said plurality of transmission terminals and an input/output terminal as a drain control voltage, and a voltage given by a logical-OR of the gate control voltages of the plurality of switching circuit sections connected to said plurality of transmission terminals, and said reference voltage is applied to drain terminals or source terminals of field effect transistors of said plurality of switching circuit sections connected to said plurality of reception terminals as the drain control voltage.

6. A high frequency switching circuit, comprising:

a plurality of switching circuit sections arranged between a plurality of input/output terminals which output and input a high frequency signal, wherein:

each of said plurality of switching circuit sections is comprised of a circuit consisting of a plurality of field effect transistors connected in series, and a gate control voltage is applied to gate terminals of said plurality of field effect transistors, so that an on-state and an off-state are achieved, a drain control voltage is further applied to drain terminals or source terminals of said plurality of field effect transistors of each of said plurality of switching circuit sections, a voltage according to an electric power value of the high frequency signal supplied to said plurality of switching circuit sections is supplied as said gate control voltage and said drain control voltage, and a gate control voltage of said plurality of field effect transistors is given with 2 states, wherein, when a voltage with one state is given as the gate control voltage, a voltage with another state is applied to a drain or source terminal of a plurality of the field effect transistors comprising the switching circuit section to which the drain control voltage is not supplied among said plurality of switching circuit sections via a diode.

7. A high frequency switching circuit according to claim 4, wherein a gate control voltage of said plurality of field effect transistors is given with 2 states, wherein, when a voltage with one state is given as the gate control voltage, a voltage with another state is applied to a drain or source terminal of a plurality of the field effect transistors comprising the switching circuit section to which the drain control voltage is not supplied among said plurality of switching circuit sections via a diode.

8. A high frequency switching circuit according to claim 5, wherein a gate control voltage of said plurality of field effect transistors is given with 2 states, wherein, when a voltage with one state is given as the gate control voltage, a voltage with another state is applied to a drain or source terminal of a plurality of the field effect transistors comprising the switching circuit section to which the drain control voltage is not supplied among said plurality of switching circuit sections via a diode.

9. A high frequency switching circuit, comprising:

a plurality of switching circuit sections arranged between a plurality of input/output terminals which output and input a high frequency signal, wherein:

each of said plurality of switching circuit sections is comprised of a circuit consisting of a plurality of field effect transistors connected in series, and a gate control voltage is applied to gate terminals of said plurality of field effect transistors, so that an on-state and an off-state are achieved, a drain control voltage is further applied to drain terminals or source terminals of said plurality of field effect transistors of each of said plurality of switching circuit sections, a voltage according to an electric power value of the high frequency signal supplied to said plurality of switching circuit sections is supplied as said gate control voltage and said drain control voltage, and at least one of the plurality of input/output terminals is comprised of a switching circuit section for shunt, a gate control voltage of said plurality of field effect transistors is given with 2 states, wherein, when a voltage with one state is given as the gate control voltage, a voltage with another state is applied to a drain or source terminal of a plurality of the field effect transistors comprising the switching circuit section to which the drain control voltage is not supplied among said plurality of switching circuit sections via a diode, and a control voltage of said switching circuit section for shunt is employed as a voltage with opposite phase to the gate control voltage of said plurality of field effect transistors.

10. A high frequency switching circuit according to claim 4, wherein the plurality of transmission terminals and the plurality of reception terminals are comprised of the switching circuit sections used for shunt, a gate control voltage of said plurality of field effect transistors is given with 2 states, wherein, when a voltage with one state is given as the gate control voltage, a voltage with another state is applied to a drain or source terminal of a plurality of the field effect transistors comprising the switching circuit section to which the drain control voltage is not supplied among said plurality of switching circuit sections via a diode, and a control voltage of said switching circuit section for shunt is employed as a voltage with opposite phase to the gate control voltage of said plurality of field effect transistors.

11. A high frequency switching circuit according to claim 5, wherein the plurality of transmission terminals and the plurality of reception terminals are comprised of the switching circuit sections used for shunt, a gate control voltage of said plurality of field effect transistors is given with 2 states, wherein, when a voltage with one state is given as the gate control voltage, a voltage with another state is applied to a drain or source terminal of a plurality of the field effect transistors comprising the switching circuit section to which the drain control voltage is not supplied among said plurality of switching circuit sections via a diode, and a control voltage of said switching circuit section for shunt is employed as a voltage with opposite phase to the gate control voltage of said plurality of field effect transistors.

12. A high frequency switching circuit, comprising:
a plurality of switching circuit sections arranged between a plurality of input/output terminals which output and input a high frequency signal, wherein:
each of said plurality of switching circuit sections is comprised of a circuit consisting of a plurality of field effect transistors connected in series, and a gate control voltage is applied to gate terminals of said plurality of field effect transistors, so that an on-state and an off-state are achieved,
a drain control voltage is further applied to drain terminals or source terminals of said plurality of field effect transistors of each of said plurality of switching circuit sections,
a voltage according to an electric power value of the high frequency signal supplied to said plurality of switching circuit sections is supplied as said gate control voltage and said drain control voltage, and
a circuit which generates the drain control voltage comprises an OR circuit having a plurality of diodes.

13. A high frequency switching circuit according to claim 4, wherein a circuit which generates the drain control voltage comprises an OR circuit having a plurality of diodes.

14. A high frequency switching circuit according to claim 5, wherein a circuit which generates the drain control voltage comprises an OR circuit having a plurality of diodes.

15. A high frequency switching circuit, comprising:
a plurality of switching circuit sections arranged between a plurality of input/output terminals which output and input a high frequency signal, wherein:
each of said plurality of switching circuit sections is comprised of a circuit consisting of a plurality of field effect transistors connected in series, and a gate control voltage is applied to gate terminals of said plurality of field effect transistors, so that an on-state and an off-state are achieved,
a drain control voltage is further applied to drain terminals or source terminals of said plurality of field effect transistors of each of said plurality of switching circuit sections,
a voltage according to an electric power value of the high frequency signal supplied to said plurality of switching circuit sections is supplied as said gate control voltage and said drain control voltage, and
the high frequency switching circuit is integrated by a semiconductor device on a semiconductor substrate.

16. A semiconductor device which integrates a high frequency switching circuit according to claim 4 on a semiconductor substrate.

17. A semiconductor device which integrates a high frequency switching circuit according to claim 5 on a semiconductor substrate.

* * * * *